United States Patent [19]

Chapman et al.

[11] Patent Number: 4,717,006

[45] Date of Patent: Jan. 5, 1988

[54] COIN DISCRIMINATING APPARATUS USING COIL PULSES OF DIFFERENT LENGTHS

[75] Inventors: Colin K. L. Chapman, Oswestry; Geoffrey Howells, Cosham, both of England

[73] Assignee: Cash & Security Equipment Limited, London, England

[21] Appl. No.: 768,016

[22] Filed: Aug. 21, 1985

Related U.S. Application Data

[63] Continuation of Ser. No. 577,670, Feb. 7, 1984, abandoned.

[30] Foreign Application Priority Data

Feb. 9, 1983 [GB] United Kingdom ................ 8303587

[51] Int. Cl.[4] ...................... G07F 3/02; G01N 27/72; G01R 33/12

[52] U.S. Cl. .................................... 194/318; 324/236; 324/239; 324/226

[58] Field of Search ............................... 324/232-236, 324/239, 262; 194/99, 100 R, 100 A

[56] References Cited

U.S. PATENT DOCUMENTS

| | | | |
|---|---|---|---|
| 3,869,663 | 3/1975 | Tschierse | 324/239 X |
| 3,929,213 | 12/1975 | Verrill | 194/100 A |
| 3,933,232 | 1/1976 | Searle et al. | 194/100 A |
| 3,962,627 | 6/1976 | Ptacek et al. | 324/225 X |
| 4,128,158 | 12/1978 | Dautremont, Jr. | 194/100 A |
| 4,226,323 | 10/1980 | Dautremont | 194/100 A |
| 4,254,857 | 3/1981 | Leuasseur et al. | 194/100 A |
| 4,257,010 | 3/1981 | Bergmann et al. | 324/236 X |
| 4,333,557 | 6/1982 | Kozak | 194/99 X |
| 4,375,082 | 2/1983 | Lohrmann | 307/265 X |
| 4,441,037 | 4/1984 | Gaertner et al. | 307/265 |
| 4,460,080 | 7/1984 | Howard | 194/100 A |
| 4,470,015 | 9/1984 | Hirschi et al. | 324/329 |
| 4,507,612 | 3/1985 | Payne | 324/233 X |

FOREIGN PATENT DOCUMENTS

| | | | |
|---|---|---|---|
| 2041532 | 9/1980 | United Kingdom | 324/239 |

*Primary Examiner*—Reinhard J. Eisenzopf
*Assistant Examiner*—Warren S. Edmonds
*Attorney, Agent, or Firm*—Louis Bernat

[57] ABSTRACT

Various electrical coin testing arrangements are described which may be used in coin sorters or in coin validators for example. In each arrangement a transmit coil is pulsed with a rectangular voltage pulse and the eddy currents in an adjacent coin under test are monitored, either by monitoring the resulting current in the same coil or in a different coil. In one arrangement, FIG. 7, particularly suitable for a coin validator, a single coil acts as both a transmitter and receiver and is successively pulsed with voltage pulses of different lengths, and the decaying eddy currents are measured by measuring the coil voltage after delays which are longer for longer voltage pulses, in order to reduce the dynamic range requirements of the monitoring circuitry. In a second arrangement, FIG. 4, two transmit coils are used, the larger coil being larger than each of the coins to be tested, and the smaller coil being smaller than each coin.

4 Claims, 13 Drawing Figures

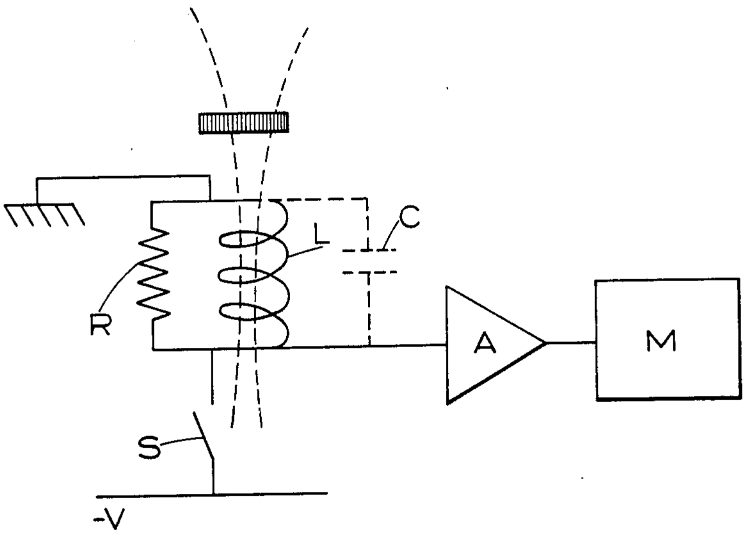
FIG. 1.
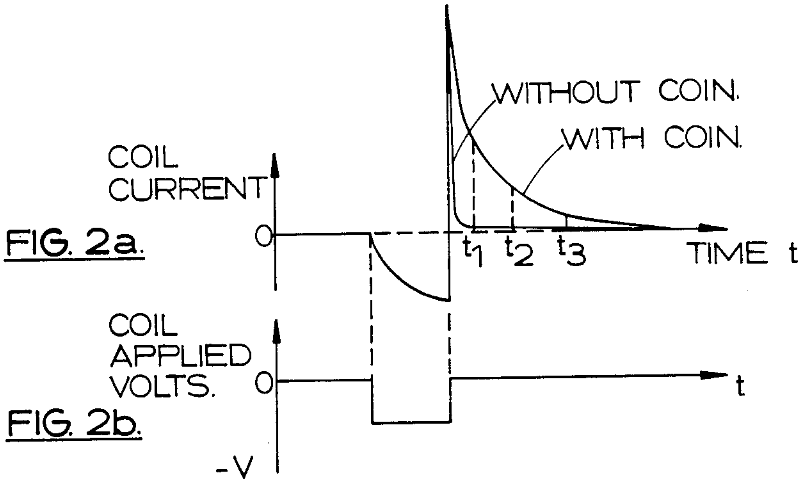
FIG. 2a.
FIG. 2b.

COIN DISCRIMINATING APPARATUS USING COIL PULSES OF DIFFERENT LENGTHS

This is a continuation of application Ser. No. 06/577,670, filed Feb. 7, 1984 abandoned This invention relates to coin discriminating apparatus.

Various proposals have been made for coin discriminating apparatus in which eddy currents are induced in a coin and the effect of the eddy currents on an electrical circuit are monitored.

In some arrangements a single coil is connected to an A.C. source and the effect of the eddy currents on the coil current is detected, whereas in other arrangements two coils are employed, one being connected to the A.C. source to induce eddy currents and the other to a monitoring circuit.

It has also been proposed in Patent Application G.B. 2 041 532A to monitor the decay of eddy currents produced in a coin by a pulse in a coil.

The known arrangements are theoretically capable of distinguishing between certain coins, but in practice they would not provide satisfactory discrimination between coins of several different denominations, and additional non-inductive coin tests would need to be employed.

In practice it may, for example, be necessary to distinguish between British 50 pence, 10 pence, 5 pence and 2 pence coins which have been validly inserted into a coin-released mechanism, and also to distinguish bogus coins such as one pence coins, washers and slugs which should not have been inserted into the particular mechanism.

The term 'coin' used hereafter is therefore intended to include bogus coins such as washers, and also tokens.

The present invention has resulted from our attempts to improve inductive coin testers to deal with situations in which a range of coins are to be distinguished.

One problem with the previously proposed arrangements is that usually they will not distinguish between coins of different diameters when they are made of the same material, and another problem is that they can even be confused by coins of quite different materials in certain circumstances.

We have studied these problems in arrangements in which eddy currents are induced in a coin by a pulse applied to a coil and the decay of the eddy currents is monitored, and we have realised that the problems are associated with the fact that the rate of decay of the eddy currents is dependent upon the ratio L/R where L is the inductance of the eddy current loop induced in the coin, and R is the resistance of that loop. The ratio L/R can be the same for different denominations of coin.

For example, the ratio L/R is the same for 1976 2p coins and some worn one shilling coins dated prior to 1948, when the coins are encircled by the pulsed coil, even though the material of the coins is quite different.

According to one aspect of our invention a coin discriminating apparatus comprises first and second transmitting coils of larger and smaller effective cross-sectional areas respectively, means for applying a voltage pulse to one of the transmitting coils followed by a voltage pulse to the other transmitting coil, and means for monitoring the decay of eddy currents produced in a coin by the lagging edge of the resulting current pulses in the coils when the coin is positioned adjacent to the respective coils.

Preferably the projected effective cross-sectional area of the first coil onto a coin positioned adjacent to that coil by location means is arranged to be greater than that of the face of at least most of the coins that are to be distinguished, and the location means is so arranged that the boundary of said projected area of the first coil encircles the coin when the eddy currents are induced in the coin by pulsing of the first coil, and the arrangement is such that the projected effective cross-sectional area of the second coil lies within the area of the face of at least most of the coins when the coin is positioned adjacent to the second transmitting coil by the location means and that coil is pulsed.

The first coil of larger area will induce currents in the periphery of a coin positioned adjacent to it, so that the diameter of the eddy current loop in the coin will be substantially that of the coin, and will therefore differ for coins of different diameters. However, the diameter of the eddy current loop induced in coins by the second coil of smaller area will be substantially the same for different coins.

Since the rate of decay of eddy currents is dependent upon the ratio L/R of the short circuit turn, and the inductance L is proportional to the area of the turn $\pi r^2$, where r is the radius of the short circuit turn, and the resistance R is proportional to p.2$\pi$r, where p is the resistivity of the material of the coin through which the eddy currents flow, the rate of decay is dependent on the ratio r/p. This ratio for eddy currents induced by the first coil will vary in dependence upon both the coin diameter and resistivity, whereas for eddy currents induced by the second coil r is substantially constant so that the ratio r/p will change only for materials of different resistivities.

Thus, monitoring the rates of decay of eddy currents produced by the two coils substantially increases the chances of distinguishing between coins of various materials and diameters.

It will be appreciated that measurements on the decaying eddy currents produced by one transmitting coil should be completed before eddy currents are induced by pulsing of the other transmitting coil.

The first coil may be pulsed prior to the second coil or vice versa.

The first and second transmitting coils are preferably positioned such that the coin being tested is substantially in the same position during pulsing of the first and second coils, but if desired the transmitting coils may be placed at spaced positions along a coin path. The measurements can be made extremely quickly so that it does not matter if the coins are moving quickly past the coils.

One or both of the transmitting coils may also act as a receiver coil responsive to the induced eddy currents and connected to the monitoring circuit, or one or more independent receiver coils may be provided.

In a preferred arrangement the first and second coils are positioned together, and the first coil acts as the receiver coil both for when the first coil is pulsed and when the second coil is pulsed.

The monitoring circuit is preferably arranged to measure the magnitude of the decaying eddy currents at three predetermined times subsequent to the initiation of the eddy currents. At first sight it might appear that measurement of the coil current at only two times would be sufficient to characterise the decay curve. However, since the eddy current distribution in the coin changes with time, in particular in relation to the depth of the eddy currents in the coin, and since some coins are plated, the third measurement can help to distinguish between plated and un-plated coins. This is because two points define a unique exponential as well as a straight line. The decay is not a simple exponential due to the skin depth effect. As the eddy current loop decays the cross sectional area through which the eddy currents flow reduces. This results in the resistance and inductance of the loop increasing. However, the inductance of the loop increases faster than the resistance so the decay rate is slower than a simple exponential. This effect is more marked if the coin is thicker and is thereby used to detect coin thickness.

The receiver coil is preferably arranged to be critically damped by a suitable choice of the input resistance of the monitoring circuit to enable the measurements to be made in a minimum time.

The transmitting coils may be in the form of printed circuit spirals, possibly arranged as two concentric spirals.

A further problem which arises with inductive coin testers is that when the eddy currents are induced in the surface of a plated coin it is the resistivity of the plating which is effectively being measured, and it is necessary in some circumstances to be able to distinguish between plated and un-plated coins.

According to a second aspect of the invention a coin discriminating apparatus comprises coil means for inducing eddy currents in a coin, means for selectively pulsing the coil means with voltage pulses of shorter and longer durations, and means for monitoring the decay of eddy currents in the coin.

A short voltage pulse, for example a pulse of 5 μs, will induce eddy currents in the coin surface only, whereas a long voltage pulse, for example a pulse of 200 μs, will induce eddy currents in the full thickness of a coin, and so the rate of decay of the eddy currents will depend upon the resistivity of the material of the coin surface for a short pulse, and upon that of the body of the coin for a long pulse, making it possible to distinguish plated coins. The reason is that the coil current will have built up to a higher value by the end of a long voltage pulse than for a shorter voltage pulse, and accordingly larger eddy currents in the coin will result on termination of the voltage pulse.

In order to reduce the requirements as to the dynamic range of the monitoring circuitry it is preferred that the delay between the lagging edge of the voltage pulse and the measurement of the eddy currents, by sampling the current in a receiver coil, is made longer for a long voltage pulse than for a short voltage pulse.

In one embodiment in accordance with the second aspect of the invention a single coil is used both as a transmitting coil and as a receiving coil, and the coil is successively pulsed with four voltage pulses of different durations. This can provide a relatively cheap arrangement, suitable for a coin validator, since there is only one coil.

However one or both of the transmitting coils of the apparatus in accordance with the first aspect of the invention may be arranged to be pulsed with shorter and longer pulses in accordance with the second aspect of the invention to increase the information that can be ascertained by a single inductive sensing assembly.

It would, in accordance with the second aspect of the invention, also be possible for the coil means to comprise two coils, one of which is pulsed with a long pulse, the other being pulsed at a different time with a short pulse.

Coin discriminating apparatus in accordance with the invention may be used in conjuction with a microprocessor memory circuit which is arranged to learn the various characteristics of a coin when in a learn mode the apparatus is fed with a range of coins of a given denomination. The circuit stores maximum and minimum values of the various coil voltage measurements for each denomination of coin, and then in the normal operating mode the measured coil voltages of a coin under test are compared with the stored values to identify the coin. This avoids the need for an extensive calibration procedure, and can enable the apparatus to be put into operation with different coinages without the need for specific modifications or calibration to be made.

The invention will now be further described, by way of example only, with reference to the accompanying diagrammatic drawings in which:

FIG. 1 is a schematic circuit diagram of the pulsing arrangement for a single transmitting coil;

FIG. 2 is a graph illustrating the voltage pulse applied to the coil of FIG. 1 and the current in the coil produced by decaying eddy currents in a coin;

Figure 5C:
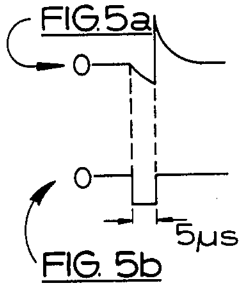
Figure 5C:
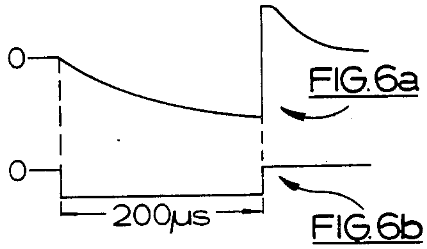
Figure 5C:
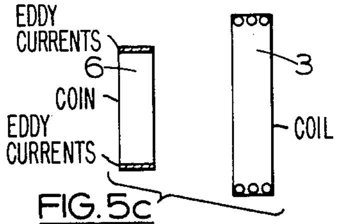
Figure 6C:
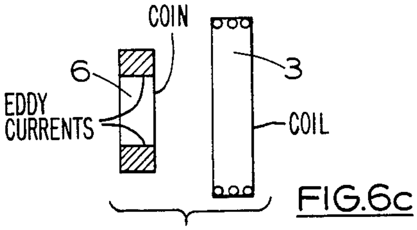
Figure 5D:
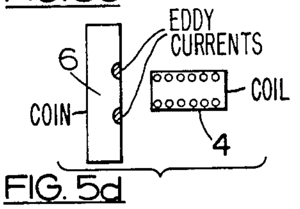
Figure 6D:
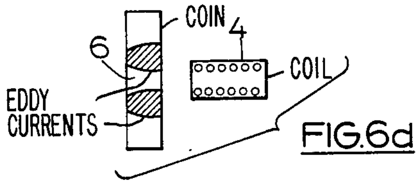
Figure 7:
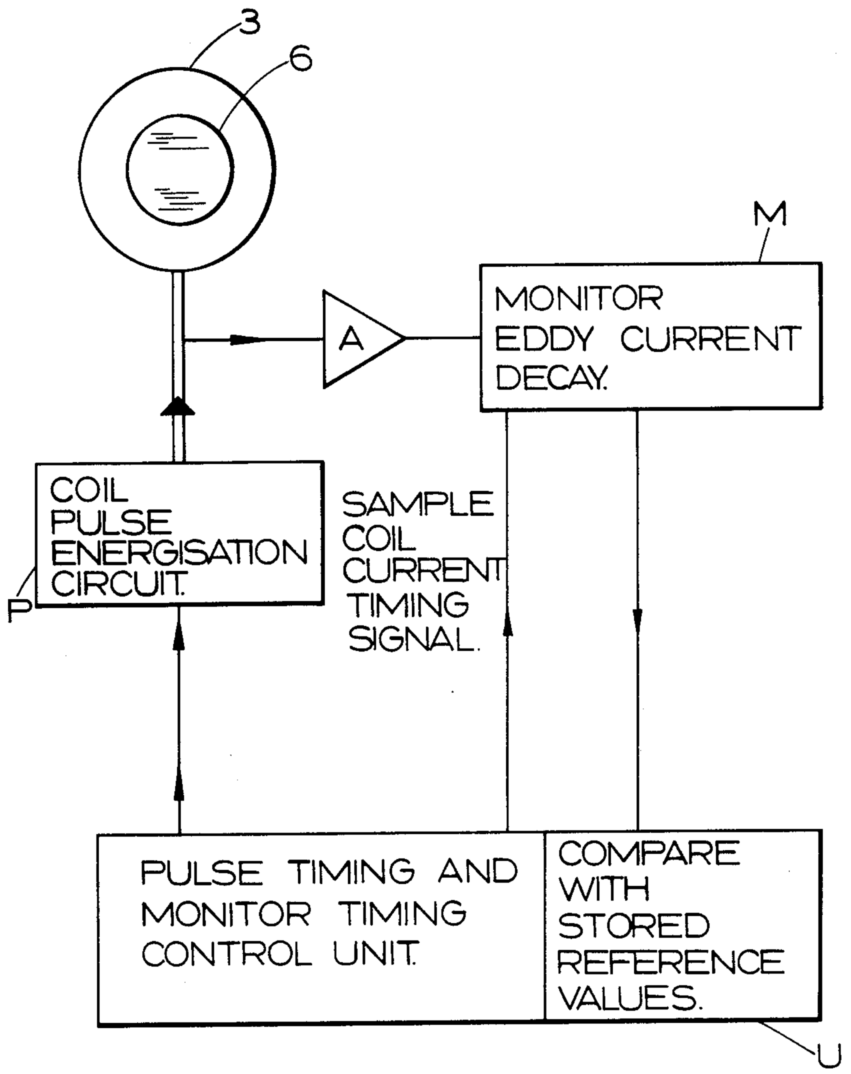
Figure 8:
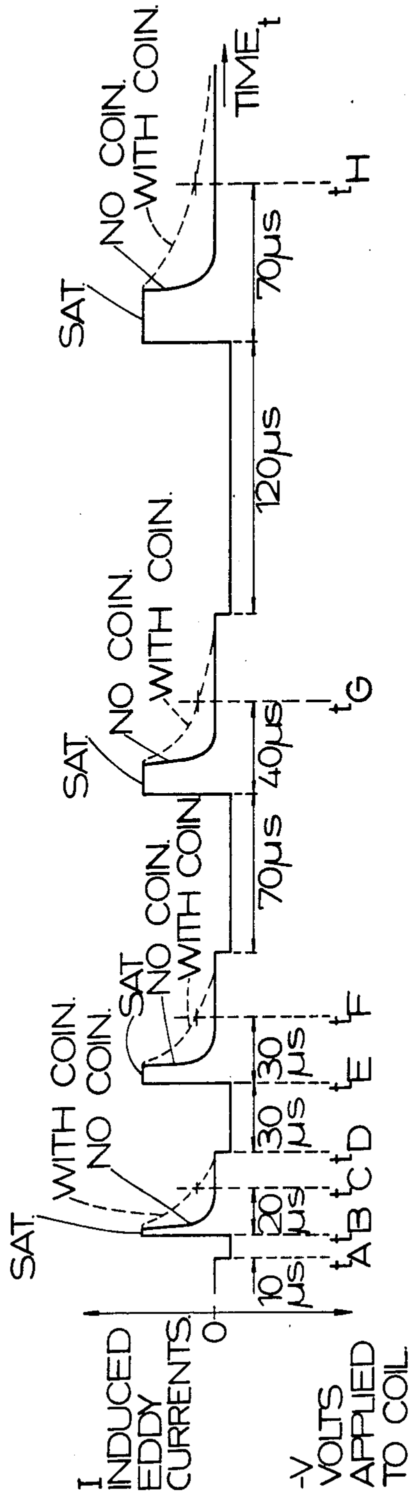
Figure 9:
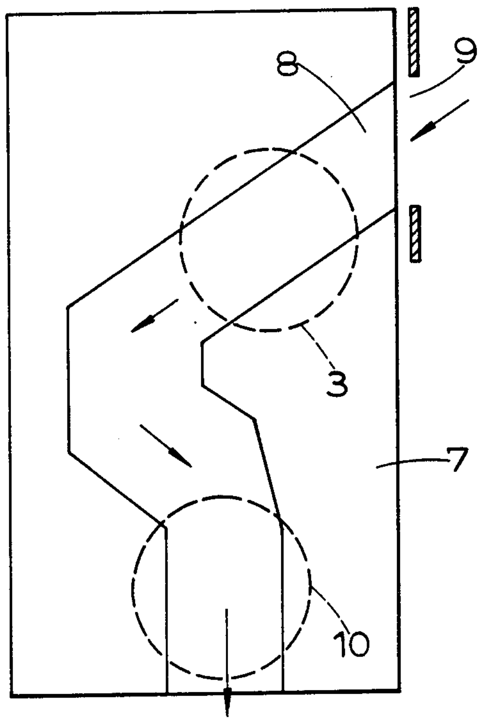

FIG. 5*a* is a plot of the coil current resulting from a 5 μs voltage pulse applied to a coil;

FIG. 5*b* shows the 5 μs voltage pulse applied to the coil;

FIG. 5*c* indicates the distribution of eddy currents in a coin produced by a coil of larger diameter than the coin when pulsed with a 5 μs pulse;

FIG. 5*d* indicates the distribution of eddy currents in a coin produced by a coil of smaller diameter than the coin when pulsed with a 5 μs pulse;

FIG. 6*a* is a plot of the coil current resulting from a 200 μs voltage pulse applied to a coil;

FIG. 6*b* shows the 200 μs voltage applied to the coil;

FIG. 6*c* shows the distribution of eddy currents in a coin produced by a coil of larger diameter than the coin when pulsed with a 200 μs pulse;

FIG. 6*d* shows the distribution of eddy currents in a coin produced by a coil of smaller diameter than the coin when pulsed with a 200 μs pulse;

FIG. 7 is a block circuit diagram of a single coil arrangement in which the coil is pulsed with a series of voltage pulses of different durations;

FIG. 8 is a composite graph of applied voltage and coil current for the arrangement of FIG. 7; and FIG. 9 is a front elevation of a coin validator in accordance with the invention.

FIGS. 1 and 2 are provided to explain the effects produced by pulsing a coil which is positioned with one end adjacent to the face of a coin. With reference to FIG. 1, the resistive and inductive components of the coil are represented by R and L respectively. The coil is connected between ground and a −V supply through a switch S, which in practice would be a suitable electronic circuit. The switch S, could be operated in response to detection of the presence of a coin at a coin testing station, but preferably it is operated by a pulse train of suitable repetition frequency to ensure that with moving coins at least one pulsing of the coil takes place with the coin adjacent to the coil.

In the arrangement of FIG. 1 the same coil is used both as a 'transmitter' and 'receiver' in that the eddy currents induced in a coin by pulsing of the coil are monitored by detecting currents in the coil which result from the eddy currents, but as previously stated independent transmitting and receiving coils could be used.

The switch S of FIG. 1 may be a VMOS transistor, such as IFR833 made by International Rectifier. This transistor is turned on by a pulse of preset length produced by a suitable electronic circuit. Such pulses may be initiated by the coin, by a coin feed mechanism, or a continuously operating pulse generator may be employed.

The currents in the coil L are monitored by a suitable monitoring circuit M connected through an amplifier A, and the stray capacitances of the coil and amplifier input are indicated as C. The input resistance of the amplifier A is arranged such that the coil L is critically damped. Closing of the switch S for a period of a few μs produces a negative square voltage pulse in the coil, shown in FIG. 2(*b*). The resulting current in the coil is shown in FIG. 2(*a*). The coil current increases in the negative direction during the presence of the voltage pulse, then reverses on termination of the voltage pulse, followed by an exponential curve $ke-(t/a)$ corresponding to the critically damped decay of current in the coil. FIG. 2 shows that when a coin is present the eddy currents induced in the coin by the trailing edge of the voltage pulse and the associated induced currents in the coil decay at a slower rate which is monitored by circuit M by measuring the coil current at three predetermined times $t_1$, $t_2$ and $t_3$ from the trailing edge of the voltage pulse.

The time constant a of the exponential curve is proportional to the ratio $L_1/R_1$ where $L_1$ is the inductance of the short circuit turn provided by the coin and $R_1$ is the resistance of that turn.

In practice the time constant a will not usually be computed. Instead it is preferred to compare the actual measurements of coil current at times $t_1$, $t_2$, $t_3$, with stored reference values or ranges. The stored values or ranges are conveniently stored in an EEPROM.

Figure 3:
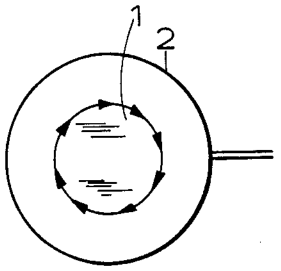
FIG. 3 is an axial view of a large coil and showing the eddy currents induced in the periphery of a coin.

FIG. 3 shows that the induced currents in a coin 1 flow around the coin periphery 1' when the coin is placed adjacent to one end of a coil 2 which is of a diameter greater than that of the coin and where the projected area of the coil covers the coin. It will be understood that in this case $L_1$ is proportional to the area of the coin face, and $R_1$ to the coin radius. The ratio $L_1/R_1$ is therefore proportional to coin radius for a given type of coin material.

Figure 4:
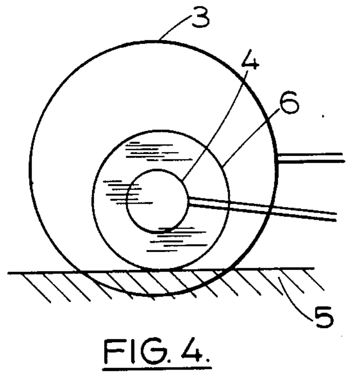
FIG. 4 is a side elevation of a coin discriminating station utilising two coils of different sizes.

FIG. 4 shows a coin discriminating station in accordance with the first aspect of the invention, and comprising large and small diameter coils 3 and 4 respectively positioned with their axes substantially parallel and with their adjacent ends closely spaced from one side of a coin path. The coins may slide along the coin path, but in this case the coins 6 are rolled along a plastics coin track 5. The larger coil 3 is of a diameter such that its projected area will cover all of the range of coins which pass along the track 5. The smaller coil 4 is of a diameter such that its projected area falls within the face of any coin within the range when it is positioned substantially centrally of the station as shown. The coils 3 and 4 are arranged to be pulsed independently and in sequence. The location of both coils 3 and 4 on the same side of the coin path and superimposed enables the larger coil 3 to be used as the receiver coil both for when that coil 3 is pulsed and also when the small coil 4 is pulsed. Due to the geometry, the larger coil 3 will have a good flux linkage with the eddy current loop induced in the coin by the smaller coil 4, and is thereby most suited to act as a receiver coil when coil 4 is pulsed. This considerably simplifies the device since only one receiver section of the circuit is required to analyse the eddy currents as detected by the larger coil 3, and the number of coils is kept to a minimum.

Another advantage of positioning the coils on the same side of the coin path is that the opposite side of the coin path may be left open, thereby minimising the chances of a coin jam.

The decaying eddy currents in the coins are monitored by a suitable monitoring circuit connected to coil 3 which in both cases compares the measurements of the current level at times $t_1$, $t_2$ and $t_3$, FIG. 2, with respective stored values or ranges. Thus a single coin will give two sets of values of coil current, a first set of three corresponding to eddy currents flowing in the periphery of the coin, and a further set of three coil currents corresponding to eddy currents flowing in a short-circuit turn of diameter substantially equal to that of the smaller coil 4.

The two sets of current values are compared by suitable circuits with stored values of coil current which preferably are derived from actual measurements by the testing apparatus on sample coins, in order to determine the nature of the coin under test. It will be appreciated that since the time constant associated with the pulsing of smaller coil 4 does not depend upon coin size, whereas that associated with the pulsing of coil 3 is dependent on size, the two sets of measurements enable many denominations of coin to be distinguished from each other without the need for additional tests to be performed. However, depending upon the range of coins to be tested, additional information may be obtained if desired by subjecting the coils of FIG. 4 to additional pulses of longer duration as will be described with reference to FIGS. 5 and 6.

Another way in which additional information about a coin may be obtained is to measure the coil current at more than three times, since although the eddy current decay curve is approximately exponential, it is not precisely so in all cases, due to the fact that the distribution of the decaying eddy currents in the coin varies with time. The eddy currents tend to penetrate to greater depths of the coin at later times, so that plated coins may be detected by making current measurements over a more extended range of the eddy current decay curve.

FIG. 5(*a*) and 5(*b*) correspond to the curves of FIGS. 2(*a*) and (*b*) respectively when a 5 μs voltage pulse is applied to a coil, and the shading in FIGS. 5(*c*) and (*d*) illustrates how the induced eddy currents in a coin flow in the periphery of the coin for pulsing of a large diameter coil, and in the surface material of the coin face for a small diameter coil. FIG. 6(*a*) to (*d*) similarly show what happens when a relatively long pulse is applied to a coil, 200 μs. In this case. With a large coil, FIG. 6(*c*), the eddy currents flow in a radially thick marginal portion of the coin, and with a small coil, FIG. 6(*d*), the eddy currents flow in a loop which extends through the full thickness of the coin.

Plated coins, as used in many countries, will show different eddy current characteristics in dependence upon the depth to which the eddy currents penetrate, and so measurements of the decaying coil current for different lengths of pulse enable plated coins to be distinguished from non-plated coins. Also, the resistance of the eddy current loop for long pulses will depend upon the thickness of the coin where the conditions are such that eddy currents would be produced through the full thickness of even a very thick coin, and such measurements may therefore be employed to determine the thickness of coins being tested.

Thus, by arranging for one or both of the coils 3, 4 of the apparatus of FIG. 4 to be pulsed successively with pulses of different lengths it is possible to detect plated coins and to measure coin thickness, in addition to coin material and diameter. Again, the measured values of time constant are preferably compared with previously recorded values for sample coins. Since the electronics can work extremely quickly it is quite feasible to carry out all of these tests at one station using two coils only whilst the coins are moving quickly through the station.

In one embodiment, not shown, the coils 3, 4 are used in conjunction with a coin sorter of the inclined disc type. An inclined disc provided with marginal recesses picks out coins one by one from a hopper. The coils are positioned at a fixed location adjacent to the path of the disc recesses and prior to a series of exit gates provided with suitable means for removing the coins from the disc recesses. The exit gates are controlled in response to the output of the monitoring circuit to sort the coins. The disc is made of a plastics material so as not to influence the eddy current production.

FIG. 7 is a block diagram of an embodiment of the invention which employs only a single coil 3 for both transmitting and receiving, and in which the coil is subject to a series of four voltage pulses of different lengths for each coin 6. The timing of the voltage pulses and the timing of the sampling of the coil current is controlled by a control unit U which contains suitable software for this purpose. The pulse and sampling sequence for the arrangement of FIG. 7 is shown in FIG. 8 which is a composite graph showing both the voltage pulses, as the negative ordinate, and the coil current, as the positive ordinate, against time t. At time $t_A$ a negative going voltage is applied to the coil 3 by a pulse energisation circuit P and the pulse is terminated after 10 $\mu$s at time $t_B$. The termination of the pulse gives rise, as in the previous arrangements described, to eddy currents in the coil which in turn produce a decaying current in the coil 3, shown as a dotted line in FIG. 8. The coil current in the absence of a coin is also shown as a full line. The clipped top SAT results from saturation of the amplifier A connected between the coil 3 and the monitoring circuit. The control unit 3 provides a timing signal to the monitor M to effect sampling of the coil current by the monitor M at a time $t_C$ which is 200 $\mu$s after $t_A$. A sufficient length of time is then allowed to pass for the coil current to have decayed substantially to zero before a second, longer voltage pulse is initiated at time $t_D$.

The second pulse lasts for 30 $\mu$s and is terminated at time $t_E$. Since a larger coil current has built up during the 30 $\mu$s voltage pulse than for the 10 $\mu$s pulse, the eddy currents produced in the coin on termination of the second pulse are greater than those for the first pulse, and accordingly the eddy currents decay more slowly. In accordance with a preferable feature of the invention the delay between the end of the second pulse and the time $t_F$ at which the coil current is sampled is made greater, 30 $\mu$s, than the corresponding delay $t_B$ to $t_C$, 2 $\mu$s, for the first pulse, in order to arrange that the coil current measured is within the dynamic range of the amplifier A and monitoring circuit M. This avoids the need for independent sampling circuits for the different pulses.

Similarly, third and fourth pulses of yet greater lengths 70 $\mu$s and 120 $\mu$s respectively are applied in succession to the coil 3 and sampling of the coil current takes place at times $t_G$ and $t_H$ respectively after delays of 40 $\mu$s and 70 $\mu$s respectively. Thus with this arrangement four values of coil current will be obtained for each coil from the measurements at times $t_C$, $t_F$, $t_G$ and $t_H$, and these four values are compared in unit U with stored reference values or ranges to determine the denomination of the coin, or whether it is not acceptable.

It will be appreciated that it would be possible to use more or less than four pulses of different lengths as necessary to obtain the required degree of discrimination. It will also be appreciated that the order of pulsing does not have to be as shown in FIG. 8.

In FIG. 7 the size of coil 3 has been chosen to be greater than the diameter of all of the coins to be measured but useful measurements could be made if the coil were to be as in FIGS. 5 (*d*) and 6(*d*).

In view of the relatively short times of the pulses and sampling periods it is quite possible to use the arrangement of FIGS. 7 and 8 to make measurements on coins as they roll freely down the inclined coin path of a coin testing mechanism, all four measurements being carried out whilst the coin 6 is within the projected area of the coil 3. A typical validator is shown schematically in FIG. 9 and comprises an inclined moulded plastics plate 7 in the upper face, the front face in the drawing, of which is provided a channel 8 defining a coin path down which coins slide/roll when inserted into a coin slot 9. Coil 3 and a further check coil 10 are encapsulated within the plate 7, just below the surface of the base of channel 8. The amplifier A, monitor M and control unit U may conveniently be mounted on a circuit board secured to the rear of plate 7.

The check coil 10 is arranged to carry out similar measurements to the principal measuring coil 3, and its purpose is to check that a coin measured by coil 3 actually reaches the lower part of the mechanism, in order to counter fraudulent use in which coins attached to strings are withdrawn from the mechanism.

It will be appreciated that validator arrangement of FIG. 9 may be arranged to operate in the manner of the FIG. 4 arrangement by incorporating the further coil 4 within coil 3.

Since all the coils of the arrangement of FIG. 9 are arranged within the moulded plate, the channel 8 can be left open thereby minimishing the chances of a coin blockage.

We claim:

1. A coin discriminating apparatus comprising means defining a coin path along which coins presented to said apparatus are caused to pass, coil means positioned adjacent to said coin path for inducing eddy currents in a coin proceeding along said coin path, pulsing means connected to said coil means for selectively pulsing said coil means with voltage pulses of shorter and longer durations, damping means permanently associated with said coil means and of a magnitude which prevents repeated oscillations of current in said coil means, eddy current detection means positioned adjacent to said coin path and responsive to decaying eddy currents in a coin proceeding along said coin path to produce an output signal, monitoring means responsive to said output signal of said eddy current detection means for monitoring the decays of said eddy currents in said coin produced by said pulses of shorter and longer durations for producing measurement values of said decays corresponding respectively to said pulses of shorter and longer durations, a reference value store for storing reference values, and means for identifying a concordance between both said measurement values and respective ones of said reference values for providing an identification signal only on detection of a concordance between both said measurement values and said reference values.

2. A coin discriminating apparatus as claimed in claim 1 wherein said coil means comprises a single coil, and said pulsing means pulses said coil successively with said pulses of different durations.

3. A coin discriminating apparatus as claimed in claim 1 wherein the delay between the lagging edge of said voltage pulses and the measurement of said eddy currents is longer for a longer voltage pulse than the corresponding delay for a shorter voltage pulse.

4. A coin discriminating apparatus as claimed in claim 1 wherein said coil means comprises first and second transmitting coils of larger and smaller effective cross-sectional areas respectively, said pulsing means being arranged for applying a voltage pulse to one of said transmitting coils followed by a voltage pulse to the other of said transmitting coils.

* * * * *

UNITED STATES PATENT AND TRADEMARK OFFICE
CERTIFICATE OF CORRECTION

PATENT NO. : 4,717,006

DATED : January 5, 1988

INVENTOR(S) : Chapman et al.

It is certified that error appears in the above-identified patent and that said Letters Patent are hereby corrected as shown below:

On the Title Page, under heading "UNITED STATES PATENT", delete "Chapman et al." and insert therefor --Howells--;

after "[75] Inventors:", delete "Colin K. L. Chapman, Oswestry;"; after Geoffrey Howells, Cosham," delete "both".

Column 6, line 59, change "In" to --in--.

Signed and Sealed this

Twelfth Day of July, 1988

Attest:

DONALD J. QUIGG

Attesting Officer

Commissioner of Patents and Trademarks